US006893681B2

(12) United States Patent
Cooray et al.

(10) Patent No.: US 6,893,681 B2
(45) Date of Patent: May 17, 2005

(54) SURFACE CONDUCTIVE RESIN, A COAXIAL CABLE, A WIRING BOARD, AND PROCESS FOR MANUFACTURING THE SAME

(75) Inventors: Nawalage Florence Cooray, Kawasaki (JP); Kanae Nakagawa, Kawasaki (JP); Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 10 days.

(21) Appl. No.: 10/256,208

(22) Filed: Sep. 27, 2002

(65) Prior Publication Data

US 2003/0090345 A1 May 15, 2003

(30) Foreign Application Priority Data

Sep. 27, 2001 (JP) .......................................... 2001-297989
Oct. 23, 2001 (JP) .......................................... 2001-324434

(51) Int. Cl.$^7$ .............................. B05D 3/00; B05D 1/36; B05D 1/38; H01B 7/17
(52) U.S. Cl. ........................ 427/304; 427/117; 427/118; 427/123; 427/125; 427/302; 427/385.5; 427/386; 427/404; 427/407.1; 427/410; 174/102 C
(58) Field of Search .............................. 427/58, 96, 117, 427/118, 123, 125, 299, 302, 304, 402, 404, 407.1, 409, 410, 385.5, 386; 428/413, 414, 416, 418, 474.4, 457, 901, 473.5; 174/102 C

(56) References Cited

U.S. PATENT DOCUMENTS

| RE29,015 E | | 10/1976 | De Angelo et al. ......... 430/319 |
| 4,340,773 A | * | 7/1982 | Perreault ..................... 174/107 |
| 2002/0004180 A1 | * | 1/2002 | Hotta et al. ................. 430/311 |

FOREIGN PATENT DOCUMENTS

| JP | 6-256960 | 9/1994 |
| JP | 10-245444 | 9/1998 |
| JP | 11-12504 | 1/1999 |
| JP | 11-246977 | 9/1999 |
| JP | 2001-73159 | 3/2001 |

* cited by examiner

*Primary Examiner*—Michael J. Feely
(74) *Attorney, Agent, or Firm*—Westerman, Hattori, Daniels & Adrian, LLP

(57) ABSTRACT

A process to manufacture a surface-conductive resin in a short time at a low cost without damaging the main chain of a polymer is provided. The process for manufacturing surface-conductive resin comprises partially substituting a reactive group in at least one of a resin precursor and a semi-cured resin having at least one reactive group partially substitutable under alkaline condition by an alkali metal ion solution, exchanging the substituted alkali metal ion with the ion of a conductive material in the ionic solution, reducing the ion of the conductive material to deposit the conductive layer, then curing the resin, to get surface-conductive polymer/resin.

22 Claims, 4 Drawing Sheets

SURFACE CONDUCTIVE RESIN, A COAXIAL CABLE, A WIRING BOARD, AND PROCESS FOR MANUFACTURING THE SAME

BACKGROUND OF THE INVENTION

1. Field of the Invention

The present invention relates to a surface-metallized polymers/resins that are suitable for printed wiring boards or the like, and processes for manufacturing 1) the surface-metallized polymers/resins, 2) a printed wiring boards using the surface-metallized resin, and 3) fine coaxial wirings which may suitably be incorporated in wiring boards mounted with electronic components or the like, and 4) wiring boards using the fine coaxial wirings.

2. Description of the Related Art

Conventionally, various methods have been proposed to metallize the surface of insulating resins such as polyimides or the like for the purpose of forming a wiring boards or the like Among them, dry processes using vacuum apparatus such as vapour deposition apparatus and sputtering apparatus or the like were found to be reliable methods capable of forming a metal tin layer with excellent uniformity and adhesion to resins. However, these dry process have some disadvantages that include high facility and maintenance cost, and difficulty in forming thin metal layers on irregularly shaped articles.

In electro-less plating, surface prtetreatment should be carried out in order to get a strong adhesion to metal. In the pretreatment process, dielectric surface is wet etched to create micro-cavities of about 1 to 3 $\mu$m, and through these cavities, the metal is anchored to the resin surface. However, in the case of polymers like polyimides, that are, susceptible to $KmnO_4$ etching process, this process cannot be applied. The Alkaline $KAnO_4$ etching would deteriorate the polymer/resin that would prevent micro cavity formation thus leading to poor adhesion to the metal.

Therefore, development of a new surface mattalization method for polyimide like polymers/resins, which gives good uniformity and adhesion like in dry processes as well as cost effectiveness like in wet process, is necessary. To satisfy this requirement a method of dipping a cured polyimide in a heated strong alkaline solution to open the imide ring in the cured polyimide, and making a noble metal ion adsorb into the carboxylic acid group, and then depositing the noble metal by the irradiation to form a desired pattern has been proposed (U.S. Pat. RE No. 29,015, Japanese Patent Application Laid-Open No. 11-246977).

Since cured polyimides undergo hydroxylation by strong alkali, the molecular weight of the polyimides on the surface decrease. This would lead to a poor adhesion to metals. However, the ring opening of the cured polyimides by a strong alkali depends on the molecular structure of the polyimide, particularly the crystallinity of the polymer. For instance, the ring opening reaction would not take place in polyimides having high crystalline structure. On the other hand, the ring opening reaction as well as depolymerization progress very rapidly in polyimides having amorphous surface, thus giving a poor adhesion to metal, Recently, coaxial wiring systems have been proposed for high speed signal transmission systems wherein electro-magnetic induction due to the adjacent lines can be minimized, and characteristic impedance can be adjusted.

At present, a printed wiring boards free from disturbance of signal waveform caused by variable crosstalk noise, characteristic impedance and the like, and suitable for high-speed signal processing have been also proposed by introducing coaxial wirings to circuit structures in the wiring boards.

To fabricate fine coaxial wirings used in such wiring boards, for example, it is known to activate, the surface of the insulator covering the central conductor by creating micro-cavities trough which the external conductor is anchored to the insulator, thus giving strong adhesion to the metal layer deposited by electroless plating or electroplating (refer to Japanese Patent Application Laid-Open No, 6-187847); to etch the surface of a porous insulator to expose holes, thereby realizing cavities that give anchor effect (refer to Japanese Patent Application Laid-Open No. 2000-2150); to mix a catalyst for electroless plating to a resin insulator and developing an electroless plating film with the exposed catalyst as a nucleus (refer to Japanese Patent Application Laid-Open No. 5-81938); or the like.

These related arts are various contrivances based on that a fluorine resin such as polyimide, polyamide, fluorinated ethylene propane (FEP), ethylene-tetrafluoroethylene (ETFE), polytetrafluoroethylene (PTFE), etc. suitable as an insulator material for coaxial cables, but hardly forms a seed layer by electroless plating due to very poor adhesion of metals.

However, since a high frequency signal transmission in coaxial wiring concentrated to the outer surface of the internal conductor and the inner surface of the external conductor, irregularities present on the insulator surface may cause disturbances to the signal waveform. Further, the mixing of the plating catalyst into the insulator may also cause degradation of high frequency characteristics of the insulator because the catalyst is mainly comprised of metals such as Pt, Pd or the like. In addition to above problems, there is also difficulty in making the terminals of fine coaxial cables.

SUMMARY OF THE INVENTION

The objects of the present invention are 1) to provide a surface-metallized resin with excellent adhesion to the metal and durability of a conductive layer on the resin surface that is suitable for printed wiring boards and the like, 2) a process for inexpensive and easy fabrication of surface metallized resins with no damage to the polymer main chain, and also suitable to metallize irregularly shaped articles, 3) to provide printed wiring boards using the surface-metallized resins.

Another objective of the present invention is to provide a super-fine coaxial cables, for instances cables having a diameter of 100 $\mu$m or less with excellent signal transmission of high frequency signals, and also excellent in incorporating property in wiring boards, and a forming method therefor.

In particular, the process of manufacturing surface-metallized resin of the present invention, at least one of the resin precursors and a semi-cured resin having at least a reactive group that undergoes substitution reaction in weak alkaline solutions is used as the starting material. The substituted alkali metal ion is exchanged with an ion of a heavy metal in an ionic solution. The ion of the heavy metal is then reduced to deposit a metal layer. Thereafter, the sample was heated to elevated temperatures to proceed the imidization reaction that simultaneously proceeds a thin metal layer on the surface of the resin.

The surface-metallized resin of the present invention is prepared according to the process for manufacturing surface-metallized resin of the present invention. It has a metal layer on the resin surface. Therefore, this surface-metallized resin can be applied in multilayer printed wiring boards and ther like.

The wiring boards of the present invention has a conductive material patterned on the surface of the electric conductive resin of the present invention, and is suitably used in multilayer printed wiring boards and the like.

The process for manufacturing a coaxial cables of the present invention comprises several steps that include: partially substituting of a reactive group in at least one of the resin precursors and a semi-cured resin having at least one reactive group in an alkaline metal ion solution; 2) exchanging the substituted alkali metal ion for the ion of a conductive material in the ionic solution of the conductive material; and a process for reducing the ion of the conductive material to deposit the conductive material, reacting the reactive group to obtain a resin, and forming a layer by the conductive material on the surface of the resin.

By adapting the above means, a superfine coaxial cable having a diameter of 100 μm or less can be easily and readily realized. This coaxial cable is excellent in transmission property in high frequency signals and also excellent in incorporating property to wiring board.

Figure 1:
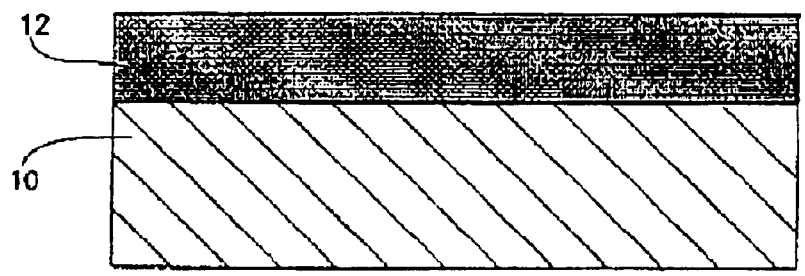
FIG. 1 is a schematic view showing an example of the state where a coating layer is formed by applying a coating solution of at least one of a resin precursor and a semi-hardened resin onto a substrate.

DESCRIPTION OF THE PREFERRED EMBODIMENTS (Process for Preparing Surface-Metallized Resin)

In the process for manufacturing surface-metallized resin of the present invention, the reactive group of at least one of a resin precursor and a semi-cured resin is partially substituted by an alkali metal ion in an alkaline solution.

In the present invention, this step is referred to as "alkali metal ion substitution step".

The resin precursor and semi-cured resin are not particularly limited and can be selected depending on the purpose, unless having at least one reactive group partially substitutable in an alkaline medium.

The reactive group is not particularly limited as long as it is partially substitutable under alkaline medium, and any one may be selected, depending on the purpose. Examples of the reactive group include carboxyl group (COOH), sulfonic group ($SO_3H$), and the like. These may be selected independently or in combinations of two or more thereof.

As the resin precursor and semi-cured resin, any one can be selected depending on the purpose without being particularly limited, suitably including, for example, materials capable of forming resins by reaction with other reactive groups. These may be used independently or in combinations of two or more. Further, these may be manufactured, and commercially available materials may be also used therefor.

As a concrete example of the resin precursor, a polyamic acid having a repeating unit expressed by the following general formula I can be suitably given. When the resin precursor is the polyamic acid, the reactive group is carboxyl group (COOH), and the number of the reactive groups is one per repeating unit.

[General Formula I]

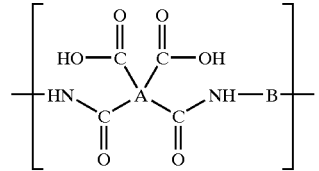

where A and B may be the same or may be different to each other, and each represents an aromatic group or aliphatic group.

The polyamic acid is a precursor of a polyimide resin, and the polyimide resin is formed of a carboxylic dianhydride and a diamine compound.

Examples of the carboxylic dianhydride include, for example, pyromellitic dianhydride, benzophenone tetracarboxylic dianhydride, 3,3',4,4'-biphenyltetracarboxylic dianhydride, 2,2-bis(3,4-benzenedicarboxylic anhydride) perfluoropropane, bis(3,4-dicarboxyphenyl)dimethylsilane dianhydride, 1,3-bis(3,4-dicarboxyphenyl)-1,1,3,3-tetramethyldicyloxane anhydride, 2,2-bis[4-(3,4-dicarboxyphenoxy)phenyl]propane dianhydride, 1,1,3,3-tetramethyl-1,3-bis[4-(1,2,3,6-tetrahydrophthalic anhydride)]dicyloxane, and the like. These may be used independently or in combinations of two or more thereof.

Examples of the diamine compound include, for example, p-phenylenediamine, m-phenylenediamine, 4,4'-diaminodiphenylmethane, 4,4'-diaminodiphenylether, 2,2'-bis(4-aminophenyl)propane, 4,4'-diaminodiphenylsulfone, 4,4'-diaminodiphenylsulfide, 1,4-bis(3-aminophenoxy)benzene, 1,4-bis(4-aminophenoxy)benzene, 1,4-bis(m-aminophenylsulfonyl)benzene, 1,4-bis(p-aminophenylsulfonyl)benzene, 1,4-bis(m-aminophenylthioether)benzene, 1,4-bis(p-aminophenylthioether)benzene, 2,2'-bis[4-(4-aminophenoxy)phenyl]propane, 2,2'-bis[3-methyl-4-(4-aminophenoxy)phenyl]propane, 2,2'-bis[3-chloro-4-(4-aminophenyoxy)phenyl]propane, 1,1'-bis[4-(4-aminophenoxy)phenyl]ethane, 1,1'-bis[3-methyl-4-(4-aminophenoxy)phenyl]ethane, 1,1'-bis[3-chloro-4-(4-aminophenoxy)phenyl]ethane, 1,1'-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone, 2,2'-bis[4-(4-aminophenoxy)phenyl]perfluoropropane, and the like.

These may be used independently or in combinations of two or more thereof.

As a concrete example of the semi-cured resin an epoxy resin of semi-cured state (B-stage) having a unit expressed by the following general formula II can be suitably given.

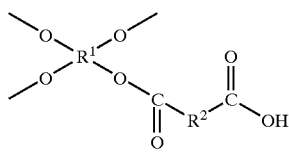

[General Formula II]

where each of $R^1$ and $R^2$ may be the same or may be different to each other and represents an aromatic group or aliphatic group.

The epoxy resin is formed of an epoxy compound and an epoxy-curing agent.

Examples of the epoxy resin suitably include a phenol novolak type epoxy, a cresol novolak type epoxy, or a halogenated epoxy thereof (e.g., as commercially available ones YDCN-701, YDCN-704, YDPN-638 and YDPN-602 by TOTO KAASEI; DEN-431 and DEN-439 by DOW CHEMICAL; EPN-1138, EPN-1235 and EPN-1299 by CIBA-GEIGY; N-730, N-770, N-865, N-665, N-673, N-695, VH-4150, VH-4240 and VH-4440 by DAINIPPON INK AND CHEMICALS; EOCN-120, EOCN-104, BRPN-1020, BREN-S manufactured by NIPPON KAYAKU; ECN-265, ECN-293, ECN-285 and ECN-299 by ASAHI KASEI; ESCN-195 by SUMITOMO CHEMICAL; etc,); a bisphenol A-type epoxy compound, a bisphenol F-type epoxy compound, a hydrogenated bisphenol A-type epoxy compound, a glycidyl ether type epoxy compound, or a halogenated epoxy compound thereof (e.g., as commercially available ones, EPICOAT 828, EPICOAT 834, EPICOAT 1001, EPICOAT 1004, and EPICOAT 1010 by YUKA SHELL; EP-410 and EP-5100 by ASAHI DENKA; EPICLON 830, EPICLON 840, EPICLON 860 and EPICLON 3035 by DAINIPPON INK AND CHEMICALS; DER-330, DER-337 and DER-361 by DOW CHEMICAL; ESB-400 by SUMITOMO CHEMICAL; etc.); and the like.

Examples of the epoxy curing agent suitably include hexahydro pyromellitic anhydride, tetrahydrophthalic anhydride, hexahydrophthalic anhydride, methyl-tetrahydrophthalic anhydride, 4-methyl-hexahydrophthalic anhydride, maleic anhydride, succinic anhydride, and the like. These may be used independently or in combination with a phenolic curing agent, an amine-based curing agent or the like.

As a concrete example of the resin precursor, a polybenzoxazol precursor or polybenzotiozol precursor having a repeating unit expressed by the following general formula III and having a carboxyl group in the side chain can be suitably given

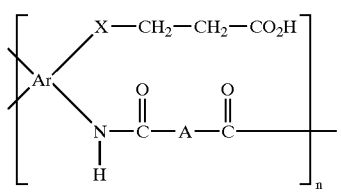

[General Formula III]

In the above general formula III, Ar represents an aromatic group. A represents an aromatic group or aliphatic group. n represents degree of polymerization,. The general formula III expresses a polybenzoxazole precursor when X is oxygen atom, and the polybenzothiozole precursor when X is sulfur atom.

The polybenzoxazole resin is formed of a bis (o-hydroxyamine) and a dicarboxylic acid, and an end capping agent for polymer such as benzocyclobutene or the like is used in the formation thereof.

Examples of the o-hydroxyamine include, for example, 1,1',1''-trifluoro-2,2'-bis(3-amino-4-hydroxyphenyl) propane, 1,1',1'',3,3',3''-hexafluoro-2,2'-bis(3-amine-4-hydroxy)propane, 2,2'-bis(3-amine-4-hydroxy)propane, and the like. These may be used independently or in combinations of two or more thereof.

Examples of the dicarboxylic acid include 2,2'-bis(4-carboxyphenyl)-1,1',1'',3,3',3''-hexafluoropropane, 2,2'-bis (4-carboxyphenyl)-1,1',1''-trifluoropropane, 2,2'-bis(4-carboxyphenyl)propane, and the like. These may be used independently or in combinations of two or more thereof.

The process for arranging at least one of the resin precursor and the semi-cured resin in the alkaline solution is not particularly limited, and the arrangement can be performed according to a method selected according to the shape of an intended surface-metallized resin or the like. When a sheet-like surface-metallized resin is intended, for example, at least one of the resin precursor and the semi-cured resin is applied onto a substrate and half-cured. The process for half-curing is not particularly limited, and the half-curing can be performed, for example, by heating at 80–150° C. for about 5–60 minutes.

Materials for the substrate are not particularly limited, and can be selected depending on the purpose. Examples thereof include a glass base, a silicon base, an aluminum nitride base, and the like.

The pH of the alkaline solution is not particularly limited as long as it shows alkalinity, and may be selected depending on the purpose. For example, weak alkaline is preferable. Concretely, the pH is preferably set to 8–12, more preferably to 9–11.

When the pH is less than 8, the partial substitution of the reactive group by the alkali metal ion cannot be effectively performed, and when it exceeds 12, the strong alkali causes the cleavage of the main chain of the resin to reduce the molecular weight. When the pH is within the above preferable numerical range, the partial substitution of the reactive group by the alkali metal ion can be efficiently performed without causing any problem such as the reduction in molecular weight of the resin due to the cleavage of the main chain of the resin because of the strong alkali or the like. This effect is remarkable in the more preferable numerical range.

As the alkaline solution, any one can be selected depending on the purpose without being particularly limited. Examples thereof include, for example, a sodium carbonate aqueous solution, a sodium bicarbonate aqueous solution, potassium carbonate aqueous solution, a potassium bicarbonate aqueous solution, a calcium carbonate aqueous solution, and the like. These may be used independently or in combinations of two or more thereof. Particularly, at least one selected from the above, sodium carbonate aqueous solution, sodium bicarbonate aqueous solution, potassium carbonate aqueous solution, potassium bicarbonate aqueous solution and calcium carbonate aqueous solution is preferable because the pH of the alkaline solution can be easily adjusted to the preferable range, that provides alkali metal ions.

As the alkali metal ion, any one can be selected, depending on the purpose without being particularly limited. For example, sodium (Na), potassium (K), calcium (Ca) and the like are suitably selected. These may be used independently or in combinations of two or more thereof. At least one selected from sodium (Na), potassium (K), and calcium (Ca) is particularly preferable As the supplying source for the alkali metal ion, any one can be selected, depending on the purpose without being particularly limited. Sodium or the like contained in the above-mentioned sodium carbonate aqueous solution, sodium bicarbonate aqueous solution or the like used as the alkaline solution is suitably used. Such a use is advantageous because the pH adjustment and the supply of the alkali metal ion can be simultaneously performed, When the carboxyl group as the reactive group in the polyamic acid of the resin precursor is, for example, substituted with an alkali metal ion for example with sodium metal ion, the structural formula I of the resin precursor is as follows.

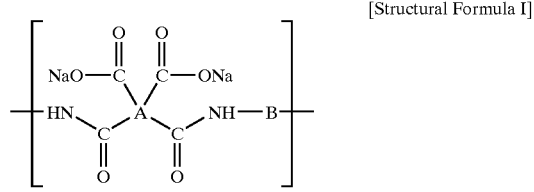

[Structural Formula I]

where A and B may be the same or may be different to each other and represent an aromatic group or aliphatic group.

In the preparation process for surface-metallized resin of the present invention, the substituted alkali metal ion is then exchanged with the ion of a conductive material in the ionic solution of the conductive material.

In the present invention, this step is referred to as "ion exchange step".

The conductive material is not particularly limited as long as it can be deposited on the resin surface, and any one can be selected depending on the purpose. For example, metals are suitably used. These may be used independently or in combinations of two or more thereof.

As the metals, any one can be selected depending on purposes without being particularly limited. Examples thereof include silver (Ag), gold (Au), cobalt (Co), nickel (Ni), copper (Cu), platinum (Pt), palladium (Pd), rhodium (Rh) and the like. These may be used independently or in combinations of two or more thereof.

Examples of the ionic solution of the conductive material suitably include an aqueous solution of a salt of the conductive material. Examples of the salt suitably include nitrate, sulfate, chlorate and the like, These may be used independently or in combinations of two or more thereof.

The concentration of the ionic solution of the conductive material is set to, for example, preferably 0.01–1.0 M, more preferably, 0.02–0.1 M.

When the concentration of the ionic solution of the conductive material is within the above preferable numerical range, the substituted alkali metal ion can be efficiently exchanged with the ion of the conductive material in the reactive group. When the concentration is within the more preferable numerical range, this effect is more remarkable.

When the sodium ion, that is the alkali metal ion substituted in the carboxyl group as the substituent in the polyamic acid of the resin precursor, is exchanged with silver ion in the ion exchange step, the structural formula II of the resin precursor is as follows.

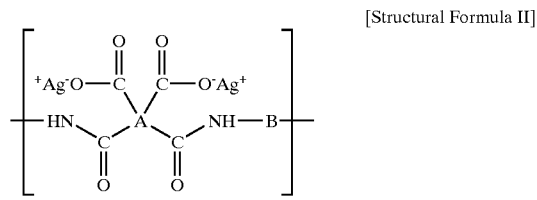

[Structural Formula II]

where A and B may be the same or may be different to each other and represent an aromatic group or aliphatic group.

In the present invention after the ion of the conductive material is reduced to deposit the conductive layer, the reactive group undergoes imidization reaction to form a resin, and a layer of the conductive material is formed on the surface of the resin.

In the present invention, his step is often referred to as "reduction and curing step".

The reduction method is not particularly limited as long as it can reduce the ion of the conductive material. The reduction can be performed by any of the conventional methods, for example, using a reducing agent, light or heat.

The reducing agent can be selected from conventional ones without being particularly limited. Examples thereof include sodium borohydride, sodium hypophosphite, and the like. These may be used independently or in combinations of two or more thereof. Particularly, at least one of the sodium borohydride and sodium hypophosphite is preferable.

Examples of the light source suitably include active beam such as ultraviolet ray and the like.

The condition for the reduction can be selected without being particularly limited. For example, the temperature is set to preferably 0–100° C., more preferably 25–50° C., and the time is set to preferably 1–30 hrs, more preferably 2–10 hrs. When a reducing agent is used in the reduction, the reducing agent has a concentration of preferably 0.01–1 M, more preferably 00.05–0.10 M.

The reduction may be performed to the whole surface of at least one of the resin precursor and the semi-hardened resin or to a part thereof. In the former case, the conductive material can be deposited on the whole surface of at least one of the resin precursor and the semi-hardened resin to form the layer by the conductive material on the whole surface. In the latter case, the conductive material can be deposited in part of the surface of at least one of the resin precursor and the semi-hardened resin to form the layer by the conductive material in the part of the surface. In the latter case, further, the reduction can be performed in a pattern, and a pattern of the conductive material is formed in this case.

After the conductive material is deposited by the reduction, polymer curing is carried out. The condition for the reaction can be selected, depending on the kinds of the resin precursor and the semi-cured resin without being particularly limited, and thus cannot be indiscriminately regulated. When at least one of the resin precursor and the semi-cured resin is a polyamic acid, the temperature is set to preferably 200–400° C., more preferably 300–400° C., and the time is set to preferably 0.5–3 hrs, more preferably 1–2 hrs. In case of the epoxy resin of semi-cured state (B-stage), the temperature is set to preferably 100–250° C., more preferably 150–200° C., and the time is set to preferably 0.5–3 hrs, more preferably 1–2 hrs. In case of the polybenzoxazole precursor or polybenzothiozole precursor having carboxyl group in the side chain, the temperature is set to preferably 200–400° C., more preferably 300–400° C., and the time is set to preferably 0.5–3 hrs, more preferably 1–2 hrs.

When at least one of the resin precursor and the semi-cured resin is a polyamic acid, the epoxy resin of semi-cured state (B-stage), or the polybenzoxazole precursor or polybenzothiozole precursor having carboxyl group in the side chain, the reactive group is cured after the deposition of the conductive material by the reduction, whereby each cured resin of the polyimide, epoxy resin, polybenzoxazole or polybenzothiozole is formed. When the conductive material is silver; for example, a polyimide with a silver layer deposited on the surface, an epoxy resin with a silver layer deposited on the surface, and a polybenzoxazole or polybenzothiozole with a silver layer precipitated on the surface are prepared, respectively.

In the above reduction and curing step, when the silver ion that is the ion of the conductive material exchanged in the carboxyl group as the substituent in the polyamic acid of the resin precursor, for example, is reduced to deposit silver, and the polyamic acid is transformed into the polyimide by the reaction of the substituent, the resulting polyimide having the silver layer on the surface has the following structural formula III.

[Structural formula III]

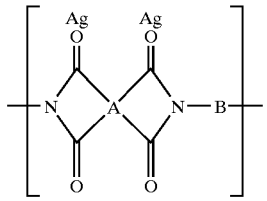

where A and B may be the same or may be different to each other and represent an aromatic group or aliphatic group.

According to the above-mentioned manufacturing process for surface-metallized resin of the present invention, a surface-metallized resin can be safely and efficiently manufactured in a short time at a low cost without damaging the main chain of the polymer.

(Surface-Metallized Resin)

The surface-metallized resin of the present invention is prepared according to the process for manufacturing surface-metallized resin of the present invention, and it has a layer of conductive material on the surface.

The thickness of the layer of the conductive material can be selected, depending on the purpose without being particularly limited. It is set to, for example, 1–50 μm, preferably 5–20 μm.

The thickness of the layer of the conductive material can be increased by electroless metal plating, sputtering, and the thickness can be decreased or removed by etching.

The surface-metallized resin of the present invention can be extensively applied to any purpose as long as it requires both the layer of conductive material and the insulating resin layer. It can be suitably used for printed wiring boards, coaxial cables and the like because of the excellent adhesion and durability of the layer of conductive material.

(Wiring Board)

The wiring board of the present invention is not particularly limited except that the layer of the conductive material on the surface of the surface-metallized resin of the present invention is patterned, in other words, that it comprises at least the insulating resin layer of the surface-metallized resin of the present invention and the layer of the conductive material. The shape, structure, and size thereof can also be selected depending on the purpose. It may be designed as a single layer circuit board (single layer printed wiring board) or a multilayer circuit board (multilayer printed printed wiring board). In the latter case, the printed wiring board of the present invention may be laminated on printed printed wiring boards.

The patterned layer of the conductive material can be formed in a desired thickness by performing the metal reduction according to the desired patterning and the resin is then cured at elevated temperatures. The metal layer on the resin is used as a seed layer for electroplating or electroless plating to get a thick layer of metal or to make via-holes. In the latter case, a resist pattern is used.

In the formation of multilayer circuit boards (multilayer printed printed wiring boards), for example, a surface-metallized resin layer is formed according to the process for manufacturing surface-metallized resin of the present invention, a resist pattern is made on the surface of the surface-metallized resin layer, electroless plating is carried out to form the via holes thereon and the resist pattern is then removed and the seed layer (silver) is etched. Thereafter, the resin precursor or semi-cured resin is applied to the surface of the surface-metallized resin layer having the via holes formed thereon, and another layer of conductive material is deposited according to the preparation process for surface-metallized polymers/resins of the present invention. This procedure is repeated, whereby the multilayer circuit board can be manufactured.

The wiring board of the present invention exhibits excellent durability and high quality. This wiring board can be cited to transmit high frequency signals because it would not give considerable signal loss that is because the surface of the wiring is comparatively smooth.

(Coaxial Wiring and Process for Forming the Same)

Figure 6:
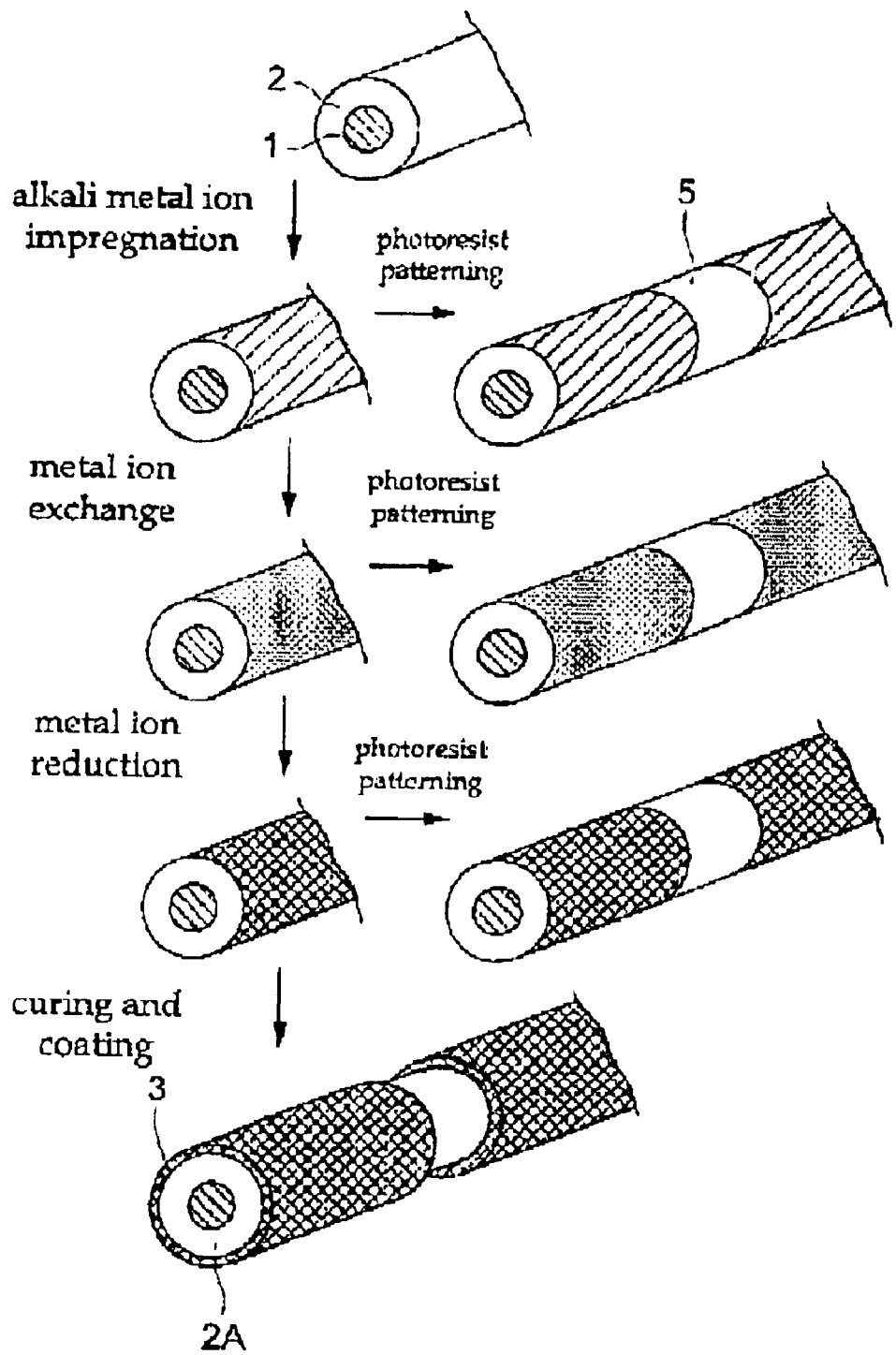
FIG. 6 is an oblique sectional view showing an example of of a coaxial cable and fabrication of process-flow of the coaxial cable of the present invention.

FIG. 6 gives the process flow of the fabrication of the coaxial cable.

In the fabrication process for coaxial wiring of the present invention, an internal conductor 1 is dipped in a varnish-like polyimide precursor, and dried at 80–150° C. to form the coating 2 of polyamic acid.

In this case, the varnish should contain a solvent, which is insoluble or hardly soluble to water.

The polyamic acid coating 2 can prevent the damage on the polyamide resin in the subsequent dipping in alkaline and metal ion aqueous solutions because the solvent is left therein.

The resulting internal conductor is then dipped in an alkaline solution. A weak base such as $KHCO_3$ or $NaHCO_3$ aqueous solution, or the like is desirable as the alkaline solution. The dipping is performed in a solution having a concentration of about 0.01–1 mol/l and for about 0.5–5 min. Under such a condition, —COOH of the Poly amic acid is reacted with the alkali to form —COOK or —COONa.

When the internal conductor is dipped in an aqueous solution having metal ions $M^{n+}$ dissolved therein, the —COOK or —COONa is changed to $(—COO^-)_n M^{n+}$.

In this case, as the metal ions, Co, Ni, Sn and the like can be used in addition to Cu, Ag, Pt. The concentration of the metal ions is set to about 0.1–5 mol/l, and the dipping time is set to about 1–5 min.

The $(-COO^-)_n M^{n+}$ is then reduced. Here, strong reducing agents such as sodium borohydride, sodium hypophosphite or the like are preferable.

The polyamic acid coating 2 is then cured in an oven in nitrogen together with a reductive gas such as hydrogen to form a cured polyimide coating 2A, and the seed metal film is plated to form the external conductor 3.

Figure 7:
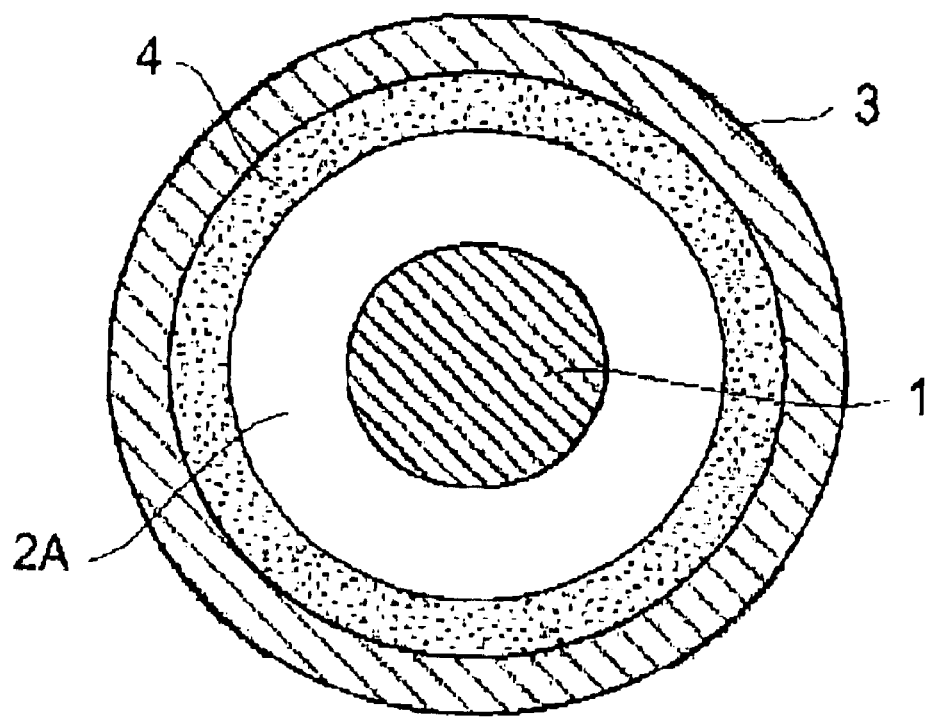
FIG. 7 is an essential part cross-sectional view showing an example of the coaxial cable for illustrating the other embodiment of the same.

The fabrication of the coaxial cable shown in FIG. 7 is completed by coating the polyamic acid after coating 4 of PTFE on the circumference of the internal conductor 1, and then performing the same procedure as in the embodiment described in FIG. 6. Since the above-mentioned coaxial cable can minimize the leak compared with the case where the insulating coating is entirely formed of a polyimide an excellent signal transmission characteristics are exhibited in high frequency bands.

In the coaxial cables described in FIGS. 6 and 7, the resin constituting the insulating coating is not limited to polyimides, and any polymer or resin can be used as long as it has at least one acidic grouping the repeating unit of the resin in semi-cured stage, or B-stage.

When the coaxial cable is incorporated into a wiring board, the connection of the internal conductor to the printed wiring board generally requires some precise techniques to make the terminals of the coaxial cable that include etching of a prescribed position of the external conductor, and etching of the insulating coating.

In such a case, since the above-mentioned steps must be performed after fixing the coaxial cable to the wiring board, the process therefore is not easy to perform. Accordingly, when the connecting length is determined, it is desired to preliminarily remove the external conductor or the insulating coating in the prescribed position of the coaxial wiring.

The present invention is suitable particularly when the above means are adapted, and the purpose can be easily attained by preventing unnecessary positions of external conductor on the surface of the precursor resin for covering the internal conductor, from contacting with at least one of the alkaline solution, an aqueous solution of inorganic metal compound, and the reducing agent used in the seed metal film forming step. As the concrete means therefor, for example, a resist may be sprayed to a required position to form a film.

In the correct process flow of FIG. 6, a photoresist film 5 is laminated on the external conductor, at locations where metal layer is not necessary.

Hereinafter, the present invention will be described in more details by way of examples. However, the present invention should not be limited to these examples.

EXAMPLE 1

As shown in FIG. 1, a coating layer 12 of a polyamic acid having a repeating unit expressed by the following structural formula IV (PI2611 by HD MICROSYSTEMS) was applied onto a substrate (AlN by IBIDEN), and the polyimide precursor was half-cured at 120° C. for 30 min.

[Structural Formula IV]

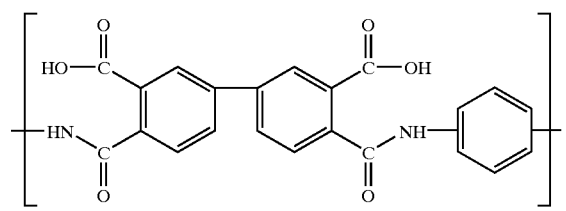

This was dipped in a 0.1M sodium carbonate ($Na_2CO_3$) aqueous solution (pH 11–12) for 5 min (at room temperature) to obtain a polyimide precursor having a repeating unit expressed by the following structural formula V, wherein the hydrogen atom of carboxyl group is substituted by sodium atom (Na), and it was then washed with water (Alkali metal ion substitution step).

[Structural Formula V]

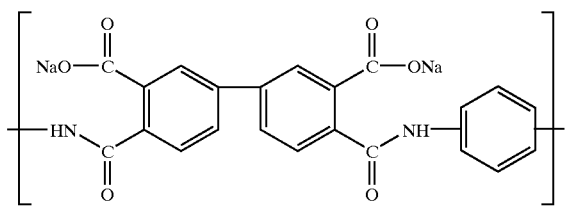

The polyimide precursor was then dipped in a 0.1M $AgNO_3$ aqueous solution for 3 min, and washed with water. Thus, a polyimide precursor having a repeating unit expressed by the following structural formula VI, wherein the sodium atom substituted in the carboxyl group was exchanged with silver ion ($Ag^+$), was obtained (Ion exchange step),

[Structural Formula VI]

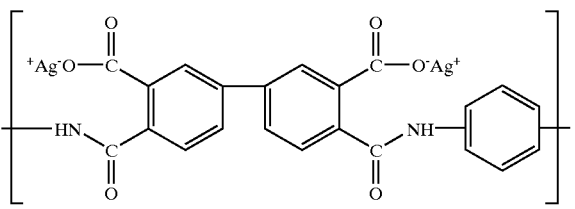

Figure 2:
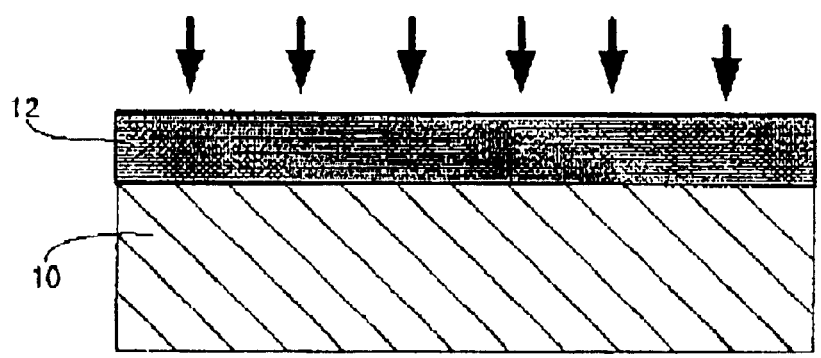
FIG. 2 is a schematic view showing an example of the state where the coating layer in FIG. 1 is irradiated with light to reduce and deposit a metal layer.

Two such polyimide precursors were prepared, and one was dipped in a 0.1M sodium borohydride aqueous solution for 5 min (at room temperature). The other was irradiated with light (@5J), as shown in FIG. 2. The polyimide precursor having a repeating unit expressed by the structural formula VII, wherein the silver ion was reduced to silver, was obtained. Each example was heated to 370° C. at a heating rate of 2° C./min, and curing was continued for 2 hours to get fully cured polyimide resin, during the curing process, a silver layer (conductive layer) 16 get deposited on the surface of a resin layer 14 of the cured polyimide resin (Reduction and imidization step) as shown in FIG. 3.

[Structural Formula VII]

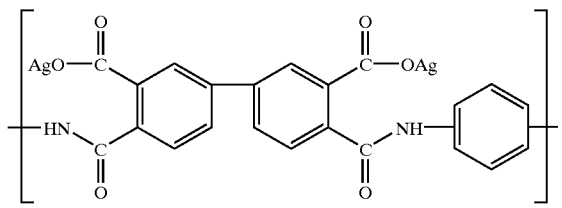

Figure 3:
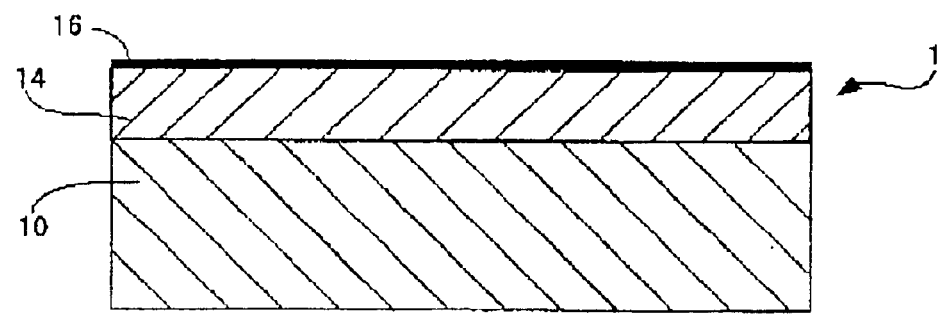
FIG. 3 is a schematic view showing an example of the state where a surface-metallized resin having a layer of conductive material on the surface is formed on a substrate.

Consequently, a polyimide (surface-metallized polymers/resins 1) having a repeating unit expressed by the following structural formula VIII, which has a silver layer 16 on the surface of the resin layer 14 of the cured polyimide resin formed on the substrate 10 as shown in FIG. 3.

[Structural Formula VIII]

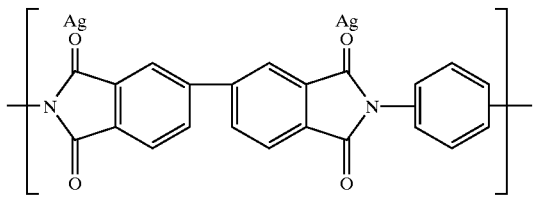

The substrate 10, the resin layer of polyimide resin 14 and the conductive layer 16 were laminated in this order and used as a wiring board, and a multilayer printed wiring board was prepared by laminating further layers on it as follows.

A photoresist pattern was made on the wiring board. This board was subjected to electroless plating by using the silver layer 16 as the seed layer. Thereafter, the photoresist was peeled off. A resist pattern having only vias exposed therefrom were formed, and the silver layer as a seed layer, which was the exposed conductive material layer 16, was thickened by electroless plating (electroplating may be adapted) with the silver layer. Thereafter, the resist pattern was dissolved off. The exposed excessive silver layer was removed by etching.

The polyimide precursor was applied onto the resulting wiring board and half-cured in the similar manner as above to form a coating layer 12. The coating layer 12 was polished by chemical-mechanical polishing, via holes were then exposed. The alkali metal ion substitution step, ion exchange step, and reduction and imidization step were then performed in the similar manner as above. The third and following layers were similarly formed. As a result, the multilayer printed wiring board could be efficiently formed.

EXAMPLE 2

Figure 4:
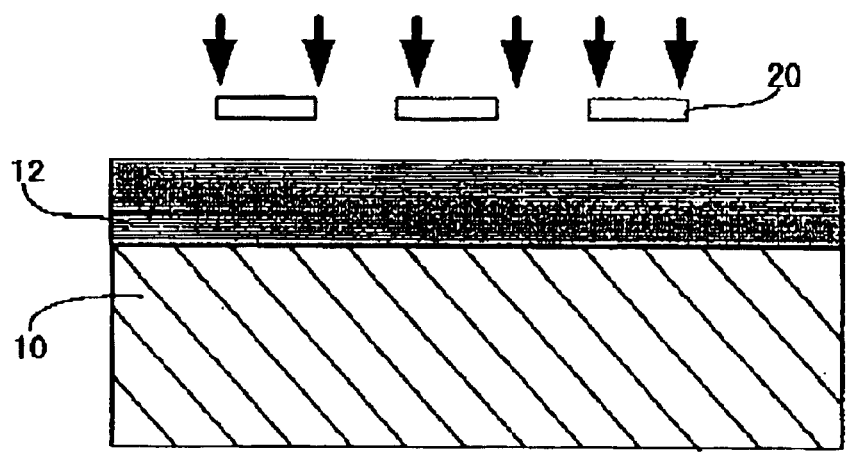
FIG. 4 is a schematic view showing an example of the state where the coating layer in FIG. 1 is irradiated with light by use of a mask to reduce and deposit the conductive material in a patterned shape.
Figure 5:
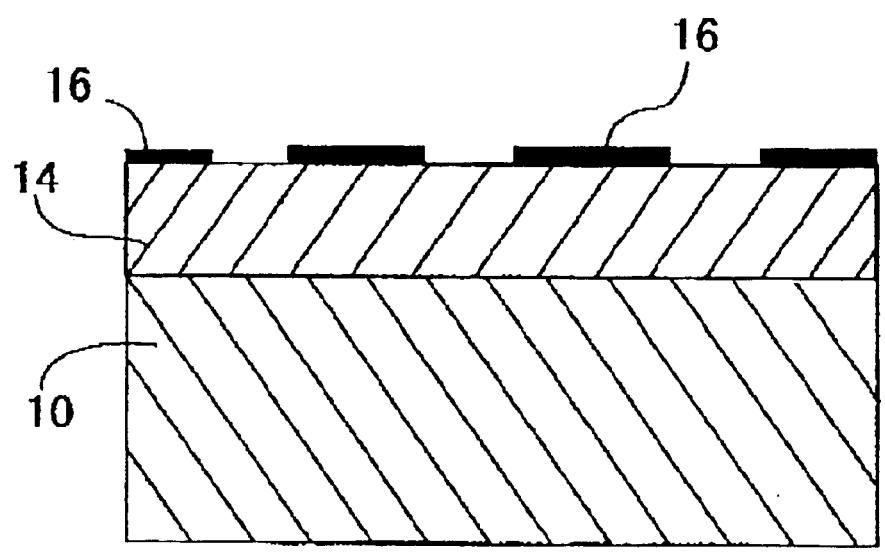
FIG. 5 is a schematic view showing an example of the state where a surface-metallized resin having a patterned layer of conductive material is formed on a substrate.

The same procedure as in Example 1 was performed except Ag+ reduction procedure. Here, Ag+ reduction was performed by using a mask 20, as shown in FIG. 4, thereby to form a patterned layer of conductive material 16 on the resin layer of cured polyimide resin 14 as shown in FIG. 5.

Comparative Example 1

The same procedure as in Example 1 was performed except that the 0.1M sodium carbonate ($Na_2CO_3$) aqueous solution (pH11–12) was changed to a 0.1M sodium hydroxide (NaOH) aqueous solution (pH 14) in the alkali metal ion substitution step in Example 1. Here, the surface of the coating was found to be degraded, and imidization could not be performed. It is believed that the high PH of the alkali metal ion solution would cleave the polyamic acid chain.

EXAMPLE 3

An internal conductor formed of copper with an outer diameter of 20 µm was dipped in a varnish-like polyimide precursor, and then dried in an oven at 80° C. for 30 min to form an insulating coating.

The polyimide precursor varnish was prepared by dissolving the precursor PI2611 (HD MICROSYSTEM) in a mixture of (7:3) N-methyl-2-pyrolidone and N-acetylpyrolidone.

The resulting polyimide was dipped in a 1M $NaHCO_3$ aqueous solution for 1 min, and then dipped in a 0.1 M $AgNO_3$ aqueous solution for 3 min, and finally dipped in a 0.005 M $NaBH_4$ aqueous solution for 1 min. to deposit a silver film on the polyimide coating.

In the above step, a photoresist may be sprayed from all directions, for example, in a width of 100 µm every 5 cm prior to dipping to the $NaHCO_3$ aqueous solution, and dried with hot air to form the film.

The coaxial cable was set in an oven filled with a mixture of $N_2$ 95%+$H_2$ 5%, heated to 375° C. at a heating rate of 2° C./min, and wiring was continued for 30 min. The film thickness from the internal conductor to the outer surface after curing was 35 µm.

Thereafter, 10 µm thick Cu layer was electroplated on the cable to form the external conductor by using the Ag layer as the seed layer. The diameter of the fabricated coaxial cable was found to be about 100 µm.

EXAMPLE 4

A PTFE resin film 17 µm in thickness was laminated on an internal conductor of copper having an outer diameter of 20 µm, and the resulting cable was dipped in a polyimide precursor varnish and dried in an oven at 80° C. for 30 min to form an insulating coating consisting of a semi-cured polyimide, which was then dried.

The polyimide precursor varnish used was prepared by dissolving the precursor PI2611 in a mixture of N-methyl-2-pyrolidone and N-acetyl pyridine (6:4).

The resulting coaxial cable was dipped in a 1M aqueous $NaHCO_3$ solution for 3 min, and then dipped in a 0.1M aqueous $CuSO_4$ solution for 3 min, and then finally dipped in a 0.005M aqueous $NaBH_4$ solution for 5 min to deposit a silver film on the surface of the polyimide insulating coating.

In the above step, a resist may be sprayed from all directions, for example, in a width of 100 µm every 3 cm prior to dipping to the $NaHCO_3$ aqueous solution, and dried with hot air to form the film.

The coaxial cable was set in an oven filled with a mixed gas of $N_2$ 95%+$H_2$ 5%, heated to 375° C. at a rate of 2° C./min, and allowed to stand for 30 min for curing. The thickness of the polyimide insulating coating after curing was 5 µm.

Thereafter, about 10 µm thick Cu layer was electroplated on the above cable by using the above Ag layer as the seed layer. The total diameter of the fabricated cable had a dimater of about 75 µm.

The present invention can solve the above-mentioned problems in the related arts. In addition, the present invention can provide a surface-metallized resin excellent in the close fitting property and durability of a conductive layer on the resin surface and suitable for printed wiring boards and the like, a process for manufacturing surface-metallized resin capable of safely and efficiently manufacturing this surface-metallized resin in a short time at a low cost without damaging the main chain of a polymer, a printed wiring board using this surface-metallized resin, which can form a complicated pattern and is excellent in durability with high quality, a super-fine coaxial cable having the diameter of 100 µm or less, excellent in transmission property in high frequency band, and also excellent in incorporating property to wiring board and a forming method therefor capable of readily and easily realizing it.

What is claimed is:

1. A process for manufacturing a surface-conductive resin comprising the steps of:

forming a layer of resin precursor, the resin precursor comprising a reactive group partially substitutable under alkaline condition;

semi-curing the layer of resin precursor;

contacting the reactive group with an alkali metal ion solution comprising an alkali metal ion so as to partially substitute the reactive group with the alkali metal ion;

contacting the substituted alkali metal ion with an ionic solution of conductive material comprising a metal ion so as to exchange the substituted alkali metal ion; and reducing the exchanged metal ion so as to deposit a conductive metal layer on the surface of the resin.

2. A process for manufacturing surface-conductive resin according to claim 1, wherein the resin precursor is a polyamic acid having a repeating unit expressed by the following general formula I, and the resin is a polyimide

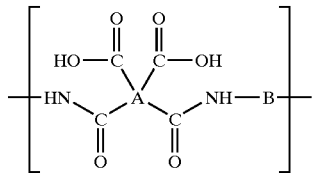

[General Formula I]

where A and B each represent an aromatic group or aliphatic group.

3. A process for manufacturing surface-conductive resin according to claim 1, wherein the resin precursor is a polybenzoxazole precursor or polybenzothiozole precursor having a repeating unit expressed by the following general formula III and having a carboxyl group in the side chain, and the resin is a polybenzoxazole or polybenzothiozole

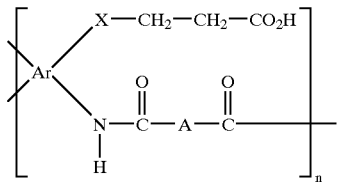

[General Formula III]

where Ar represents an aromatic group, A represents an aromatic group or aliphatic group, and X represents oxygen atom or sulfur atom.

4. A process for manufacturing a surface-conductive resin comprising the steps of:

forming a layer of semi-cure resin, the semi-cure resin comprising a reactive group partially substitutable under alkaline condition;

contacting the reactive group with an alkali metal ion solution comprising an alkali metal ion so as to partially substitute the reactive group with the alkali metal ion;

contacting the substituted alkali metal ion with an ionic solution of conductive material comprising a metal ion so as to exchange the substituted alkali metal ion with metal ion; and reducing the exchanged metal ion so as to deposit a conductive metal layer on the surface of the resin.

5. A process for manufacturing surface-conductive resin according to claim 4, wherein the semi-cured resin is a epoxy resin in semi-cured state having a unit expressed by the following general formula II, and the resin is an epoxy resin

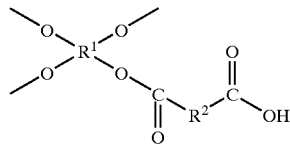

[General Formula II]

where $R^1$ and $R^2$ each represent an aromatic group or aliphatic group.

6. A process for manufacturing surface-conductive resin according to one of claims 1 and 4, wherein the reactive group partially substitutable under alkaline condition is a carboxylic acid group.

7. A process for manufacturing surface-conductive resin according to one of claims 1 and 4, wherein the alkaline solution has a pH range of from about 8 to about 12.

8. A process for manufacturing surface-conductive resin according to one of claims 1 and 4, wherein the alkaline solution is at least one selected from a sodium carbonate aqueous solution, a sodium bicarbonate aqueous solution, a potassium carbonate aqueous solution, a potassium bicarbonate aqueous solution, and a calcium carbonate aqueous solution.

9. A process for manufacturing surface-conductive resin according to one of claims 1 and 4, wherein the alkali metal ion is at least one selected from Na, K and Ca.

10. A process for manufacturing surface-conductive resin according to one of claims 1 and 4, wherein the ionic solution of the conductive material has a concentration range of from about 0.02M to 1M.

11. A process for manufacturing surface-conductive resin according to one of claims 1 and 4, wherein the conductive material is a metal.

12. A process for manufacturing surface-conductive resin according to claim 11, wherein the metal is at least one selected from Ag, Au, Co, Ni, Cu, Pt Pd, and Rh.

13. A process for manufacturing surface-conductive resin according to one of claims 1 and 4, wherein the reduction is performed by using a reducing agent or UV light.

14. A process for manufacturing surface-conductive resin according to claim 13, wherein the reducing agent is at least one of sodium borohydride and sodium hypophosphite.

15. A process for manufacturing surface-conductive resin according to one of claims 1 and 4, wherein the reduction is performed in a pattern.

16. A process for manufacturing surface-conductive resin according to one of claims 1 and 4, wherein the resin is cured after depositing the conductive material.

17. A process for manufacturing a coaxial cable comprising the steps of:

forming a layer of at least one of a resin precursor and a semi-cured resin over an internal conductor, wherein said at least one of a resin precursor and a semi-cured resin comprises a reactive group partially substitutable under alkaline condition:

contacting the reactive group with an alkali metal ion solution comprising an alkali metal ion so as to partially substituting the reactive group with the alkali metal ion;

contacting the substituted alkali metal ion with an ionic solution of conductive material comprising a metal ion so as to exchanging the substituted alkali metal ion with the metal ion; and reducing the exchanged metal ion to deposit a conductive metal layer, on the surface of the resin.

18. A process for manufacturing a coaxial cable according to claim 17, wherein the ionization tendency of the alkali metal ion is noble, compared with Co.

19. A process for manufacturing a coaxial cable according to claim 17, wherein said at least one of a resin precursor and a semi-cured resin are obtained by dipping the internal conductor in a precursor varnish.

20. A process for manufacturing a coaxial cable according to claim 17, wherein said at least one of a resin precursor and a semi-cured resin has a structure having one or more acidic groups in the repeating unit of said at least one of a resin precursor and a semi-cured resin.

21. A process for manufacturing a coaxial cable according to claim 17, wherein a step for forming a protective film to prevent partial contact of the: a) coating formed of said at least one of a resin precursor and a semi-cured resin; and b) one or more of the alkaline solution, the ionic solution of the conductive material, and the reducing agent; is performed before the step for reducing the ion of the conductive material.

22. A process for manufacturing a coaxial cable according to claim 17, wherein the alkaline solution has a pH range of from about 8 to about 12.

\* \* \* \* \*